US010418259B2

(12) United States Patent
Kim et al.

(10) Patent No.: US 10,418,259 B2
(45) Date of Patent: Sep. 17, 2019

(54) APPARATUS FOR LAMINATING A TAPE FILM ON A SUBSTRATE AND A SYSTEM OF FABRICATING A SEMICONDUCTOR DEVICE USING THE SAME

(71) Applicant: Samsung Electronics Co., Ltd., Suwon-si (KR)

(72) Inventors: Youngmin Kim, Asan-si (KR); JaeYong Park, Cheonan-si (KR); Kunho Song, Asani-si (KR); Byung-Joo Jo, Asan-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 232 days.

(21) Appl. No.: 15/335,988

(22) Filed: Oct. 27, 2016

(65) Prior Publication Data
US 2017/0133249 A1 May 11, 2017

(30) Foreign Application Priority Data

Nov. 11, 2015 (KR) ........................ 10-2015-0158175

(51) Int. Cl.
| H01L 21/67 | (2006.01) |
| H01L 23/00 | (2006.01) |
| H01L 21/683 | (2006.01) |
| H01L 21/78 | (2006.01) |
| B28D 5/02 | (2006.01) |
| B28D 5/00 | (2006.01) |
| B32B 37/10 | (2006.01) |
| B32B 38/00 | (2006.01) |

(52) U.S. Cl.
CPC ...... *H01L 21/67132* (2013.01); *B28D 5/0082* (2013.01); *B28D 5/022* (2013.01); *B32B 37/1009* (2013.01); *H01L 21/67092* (2013.01); *H01L 21/6836* (2013.01); *H01L 21/6838* (2013.01); *H01L 21/78* (2013.01); *H01L 24/742* (2013.01); *B32B 38/0004* (2013.01); *B32B 2457/14* (2013.01); *H01L 2221/68327* (2013.01); *Y10T 156/1062* (2015.01); *Y10T 156/1322* (2015.01)

(58) Field of Classification Search
None
See application file for complete search history.

(56) References Cited

U.S. PATENT DOCUMENTS

| 5,067,762 A | 11/1991 | Akashi |
| 5,216,590 A | 6/1993 | Ota |
| 6,573,158 B2 | 6/2003 | Miyamoto et al. |
| 6,589,855 B2 | 7/2003 | Miyamoto et al. |
| 7,395,847 B2 | 7/2008 | Teshirogi et al. |

(Continued)

FOREIGN PATENT DOCUMENTS

| DE | 2013 004 536 A1 | 3/2014 |
| EP | 1 461 826 B1 | 4/2010 |

*Primary Examiner* — Linda L Gray
(74) *Attorney, Agent, or Firm* — Muir Patent Law, PLLC

(57) ABSTRACT

A tape film lamination apparatus may include a housing, a substrate holder disposed in the housing and positioned to receive a substrate, a film holder disposed on the housing and positioned to support a tape film, and an air removal unit connected to a portion of the housing below the film holder to remove and/or exhaust air from the housing resulting to attach the tape film to the substrate.

20 Claims, 9 Drawing Sheets

(56) References Cited

U.S. PATENT DOCUMENTS

| | | |
|---|---|---|
| 7,417,305 B2 | 8/2008 | Jiang et al. |
| 2005/0015170 A1 | 1/2005 | Adin et al. |
| 2005/0126686 A1 | 6/2005 | Cheong et al. |
| 2007/0004324 A1* | 1/2007 | Hirose .................... B24B 37/26 |
| | | 451/285 |
| 2009/0277379 A1 | 11/2009 | Ohmi et al. |
| 2011/0232820 A1* | 9/2011 | Yamamoto ........ H01L 21/67132 |
| | | 156/60 |
| 2012/0286429 A1 | 11/2012 | Han et al. |
| 2013/0196472 A1 | 8/2013 | Hoang et al. |
| 2014/0113413 A1* | 4/2014 | Yamamoto .......... H01L 21/6835 |
| | | 438/118 |

* cited by examiner

US 10,418,259 B2

APPARATUS FOR LAMINATING A TAPE FILM ON A SUBSTRATE AND A SYSTEM OF FABRICATING A SEMICONDUCTOR DEVICE USING THE SAME

CROSS-REFERENCE TO RELATED APPLICATIONS

This application claims priority under 35 U.S.C. § 119 to Korean Patent Application No. 10-2015-0158175, filed on Nov. 11, 2015, in the Korean Intellectual Property Office, the entire contents of which are hereby incorporated by reference.

BACKGROUND OF THE INVENTION

The present disclosure relates to a system for fabricating a semiconductor device, for example, to a lamination apparatus for attaching a tape film to a substrate and a system for fabricating a semiconductor device using the same.

Recently, larger sized wafers are being used to obtain more semiconductor chips from the wafer. For example, the use of a large size wafer may improve productivity of the semiconductor fabrication process. However, the large size wafer should be carefully handled because it may be vulnerable to an impact and/or vibration. For example, a tape film may be attached to a wafer before performing a dicing process on the wafer to protect the wafer and/or the diced chip dies. Then the wafer is cut into a plurality of chip dies by a saw or a laser beam. The use of the tape film may be beneficial to prevent the wafer and the chip dies from sliding or bounding during the dicing process or to reduce such occurrences.

SUMMARY

Exemplary embodiments of the inventive concept provide a lamination apparatus, which is configured to attach a tape film to a substrate without a layer of protecting bumps, and a system of fabricating a semiconductor device using the same.

Exemplary embodiments of the inventive concept provide a lamination apparatus, which is configured to attach a tape film to a substrate without bubbles, and a system of fabricating a semiconductor device using the same.

According to exemplary embodiments of the inventive concept, a lamination apparatus may include a first housing, a substrate holder disposed in the first housing and positioned to receive a substrate, a film holder disposed on the first housing and positioned to support a tape film, and a first air removal unit connected to the first housing. The first air removal unit may be positioned to remove air in the first housing in order to attach the tape film to the substrate.

According to exemplary embodiments of the inventive concept, a system of fabricating a semiconductor device may include a packaging apparatus configured to attach a plurality of bumps to a first surface of a substrate, a lamination apparatus configured to attach a tape film to a second surface of the substrate facing the first surface, and a dicing apparatus configured to cut the substrate attached to the tape film into a plurality of dies. The lamination apparatus may include a first housing, a substrate holder disposed in the first housing and configured to receive the substrate, a film holder disposed on the first housing and configured to support the tape film, and a first air removal unit connected to the first housing. The first air removal unit may be configured to remove air in the first housing in order to attach the tape film to the second surface of the substrate.

According to exemplary embodiments of the inventive concept, a lamination apparatus may include a chamber, a substrate holder disposed in the chamber and configured to receive a substrate, a film holder disposed on the substrate holder and configured to support a tape film, and a first air removal unit connected to the chamber. The air discharging unit may be configured to remove air between the substrate and the tape film and thereby to attach the tape film to the substrate.

According to exemplary embodiments of the inventive concept, a lamination apparatus may include a chamber formed in a lower housing and an upper housing positioned on the lower housing, a substrate holder disposed in the lower housing and positioned to receive a substrate, a film holder disposed between the lower and upper housings, the film holder being configured to support a tape film, and a first air removal unit connected to the lower housing, the first air removal unit being configured to remove air from the lower housing and thereby to attach the tape film to the substrate.

According to certain embodiments, a semiconductor device manufacturing apparatus, may include a chamber, a substrate holder disposed in the chamber and positioned to receive a substrate, a film holder disposed in the chamber and positioned to support a tape film, and a first air removal unit connected to the chamber. The first air removal unit may be configured to remove air from the chamber and to lower the air pressure between the substrate and the tape film.

BRIEF DESCRIPTION OF THE DRAWINGS

Example embodiments will be more clearly understood from the following detailed description taken in conjunction with the accompanying drawings. The accompanying drawings represent non-limiting, example embodiments as described herein.

Figure 1:
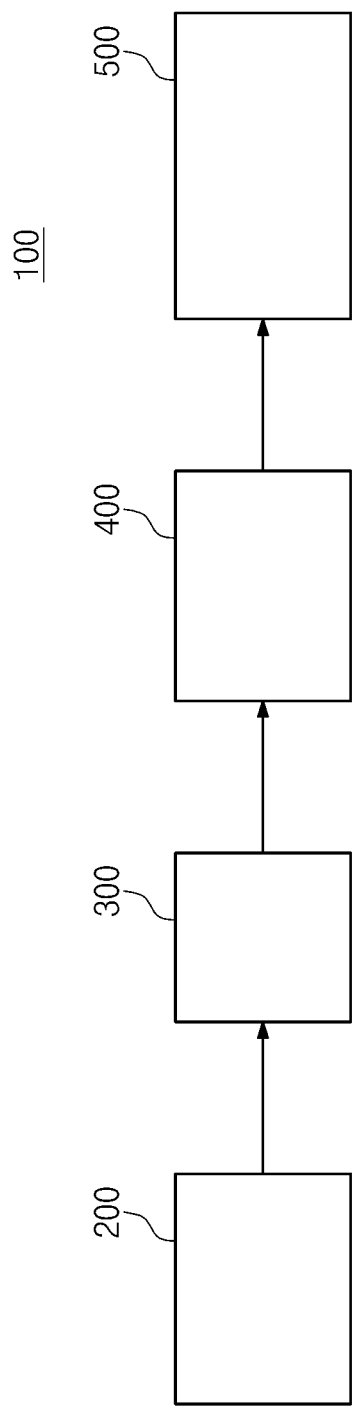
FIG. 1 is a diagram schematically illustrating a system of fabricating a semiconductor device according to certain exemplary embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

The inventive concepts will now be described more fully hereinafter with reference to the accompanying drawings, in which exemplary embodiments of the inventive concepts are shown. The inventive concepts and methods of achieving them will be apparent from the following exemplary embodiments that will be described in more detail with reference to the accompanying drawings. The embodiments of the inventive concept may, however, be embodied in different forms and should not be construed as limited to the embodiments set forth herein. Rather, these example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

It will be understood that when an element is referred to as being "connected" or "coupled" to another element, it may be directly connected or coupled to the other element or intervening elements may be present. Similarly, it will be understood that when an element such as a layer, region or substrate is referred to as being "on" another element, it can be directly on the other element or intervening elements may be present. In contrast, the term "directly" means that there are no intervening elements. Similarly, the term "contact" refers to a direct connection, e.g., touching, unless the context indicates otherwise. Additionally, certain embodiments in the detailed description will be described with cross-sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

FIG. 1 is a diagram schematically illustrating a system 100 of fabricating a semiconductor device according to certain exemplary embodiments of the inventive concept.

Referring to FIG. 1, the fabrication system 100 may be configured to process a substrate. In certain exemplary embodiments, the fabrication system 100 may be configured to perform a packaging process and a dicing process on a substrate. For example, the fabrication system 100 may include a packaging apparatus 200, a lamination apparatus 300, a dicing apparatus 400, and a pick-up apparatus 500. The packaging apparatus 200 may be configured to perform a package process. For example, the packaging apparatus 200 may be configured to perform a wafer level packaging process on a substrate W (e.g., see FIG. 2). The lamination apparatus 300 may be configured to attach a tape film 120 (e.g., see FIG. 3) onto the substrate W. The dicing apparatus 400 may be configured to perform a dicing process on the substrate W. The substrate W may be divided into a plurality of chip dies CD (e.g., see FIG. 9) through the dicing process. The pick-up apparatus 500 may be configured to transfer each of the chip dies CD to the outside (e.g., outside of the dicing apparatus 400).

Figure 2:
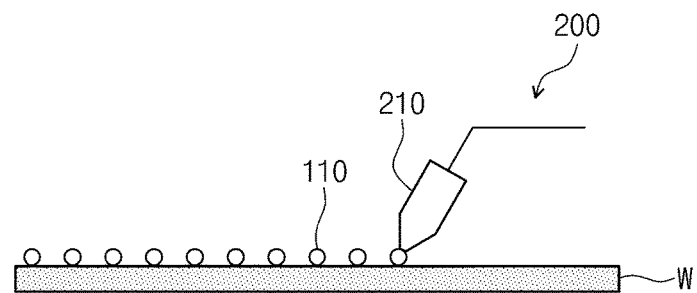
FIG. 2 is a cross-sectional view illustrating an exemplary embodiment of a packaging apparatus of FIG. 1.

FIG. 2 is a cross-sectional view illustrating an exemplary embodiment of the packaging apparatus 200 of FIG. 1.

Referring to FIG. 2, the packaging apparatus 200 may include a soldering device including a soldering iron 210. The packaging apparatus 200 may be configured to form bumps 110 on a top surface of the substrate W. The soldering iron 210 may be used to bond the bumps 110 onto the top surface of the substrate W. In certain exemplary embodiments, the bumps 110 may be bonded to a bottom surface of the substrate W. The bumps 110 may be connected to conductive lines and/or electrodes, which are provided in the substrate W. For example, the bumps 110 may be connected to through silicon vias (TSVs).

Figure 3:
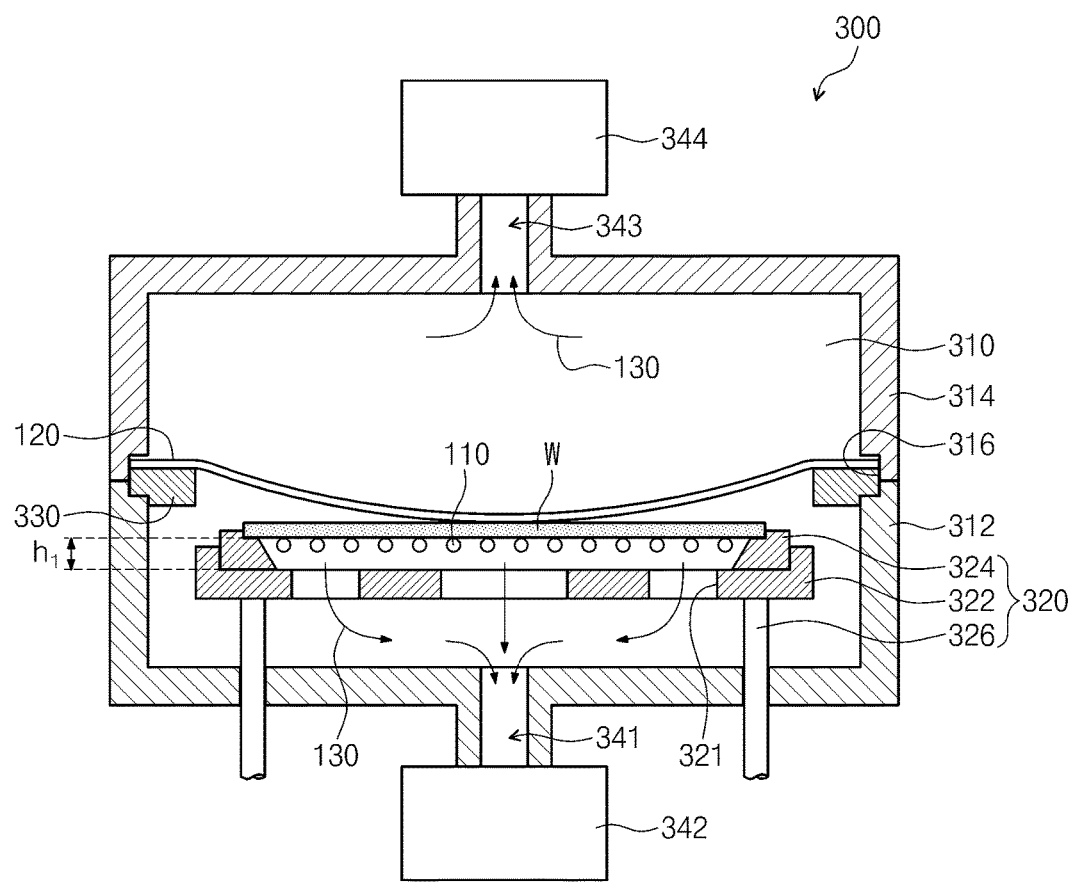
FIG. 3 is a cross-sectional view illustrating an exemplary embodiment of a lamination apparatus of FIG. 1.

FIG. 3 is a cross-sectional view illustrating an exemplary embodiment of the lamination apparatus 300 of FIG. 1.

Referring to FIG. 3, the lamination apparatus 300 may be configured to perform a lamination process of attaching a tape film 120 on the bottom surface of the substrate W, e.g., a surface opposite the surface on which the bumps 110 are formed. In some descriptions, the opposite surfaces of the substrate may be referred to as first and second surfaces, with one of those named surfaces having the bumps 110, and the other of those named surfaces being flat. The tape film 120 may include a dicing film. The tape film 120 may be attached to the bottom surface of the substrate W (e.g., the flat surface opposite the surface on which the bumps 110 are formed). In certain exemplary embodiments, the lamination apparatus 300 may include a chamber 310, a substrate holder 320, a film holder 330, and first and second air discharging units 342 and 344. The substrate W and the tape film 120 may be disposed in the chamber 310, when the lamination process is performed. The tape film 120 may contact the bottom surface of the substrate W in response to a suction pressure exerted from the first air discharging unit 342.

The chamber 310 may be configured to isolate the substrate W and the tape film 120 from the outside environment. The tape film 120 may be disposed near a center region of the chamber 310. The substrate W may be disposed below the tape film 120. In certain exemplary embodiments, the chamber 310 may be formed by a lower housing 312 and an upper housing 314, and may include the space enclosed by the lower housing 312 and upper housing 314.

The lower housing 312 may be disposed below the upper housing 314. The lower housing 312 and the upper housing 314 may be coupled to each other when the lamination process is performed. When the substrate W and the tape film 120 is unloaded from the chamber 310 after the lamination process, the lower housing 312 and the upper housing 314 may be separated from each other. The substrate W may be disposed in the lower housing 312. The tape film 120 may be disposed on the lower housing 312. The lower housing 312 may have a first air outlet 341. For example, the first air outlet 341 may be provided to penetrate a bottom of the lower housing 312. The first air outlet 341 may be connected to the first air discharging unit 342.

The upper housing 314 may be disposed on and/or over the tape film 120. The tape film 120 may be disposed between the lower housing 312 and the upper housing 314. The tape film 120 and the film holder 330 may be provided to divide an internal space of the chamber 310 into two vertically separated regions (e.g., an upper region and a lower region). The upper housing 314 may have a second air outlet 343. The second air outlet 343 may be disposed at a top surface of the upper housing 314. The second air outlet 343 may be connected to the second air discharging unit 344.

The substrate holder 320 may be disposed in the lower housing 312. The substrate holder 320 may be configured to receive the substrate W. In certain exemplary embodiments, the substrate holder 320 may include a first support 322, second supports 324, and lift pins 326.

Figure 4:
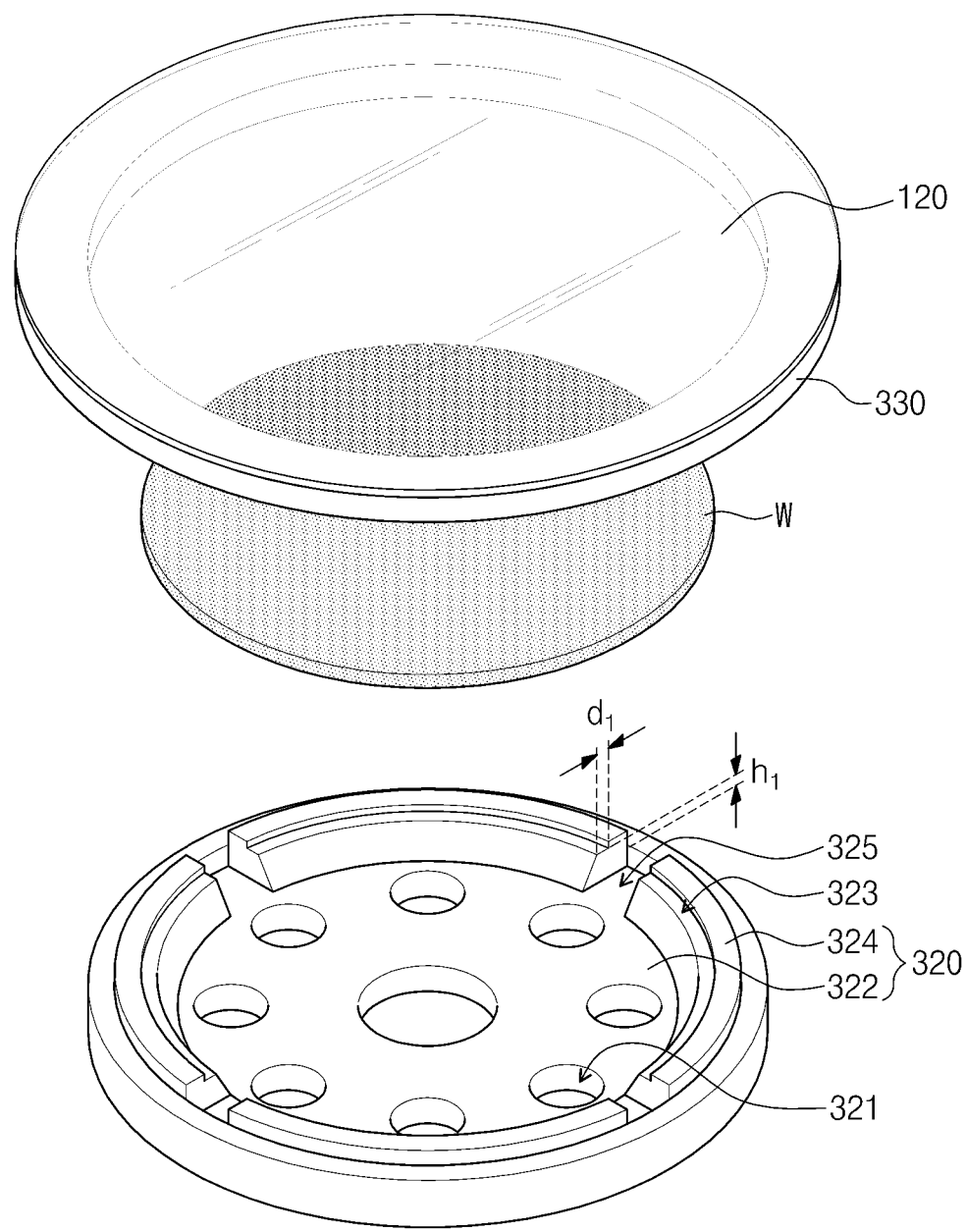
FIG. 4 is a perspective view illustrating an exemplary embodiment of a substrate holder of FIG. 3.

In certain embodiments, the second supports 324 may be merged into one piece of a second support 324. In certain embodiments, the first support 322 and second supports 324 may be integrated forming one piece that forms the substrate holder 320. The first support 322 may be an air flow plate as shown in FIG. 4. The air flow plate may have at least a hole through which air flows out from between the air flow plate and a substrate above the air flow plate.

Figure 5:
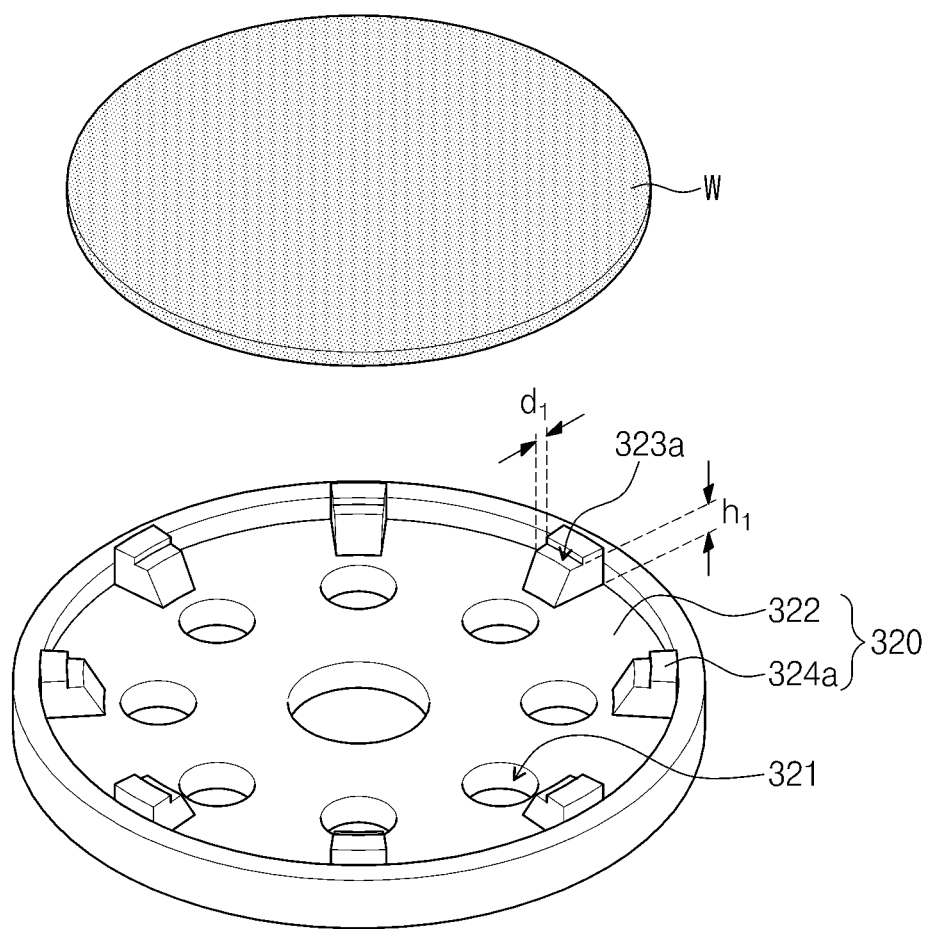
FIG. 5 is a perspective view illustrating an exemplary embodiment of a substrate holder of FIG. 3.
Figure 8:
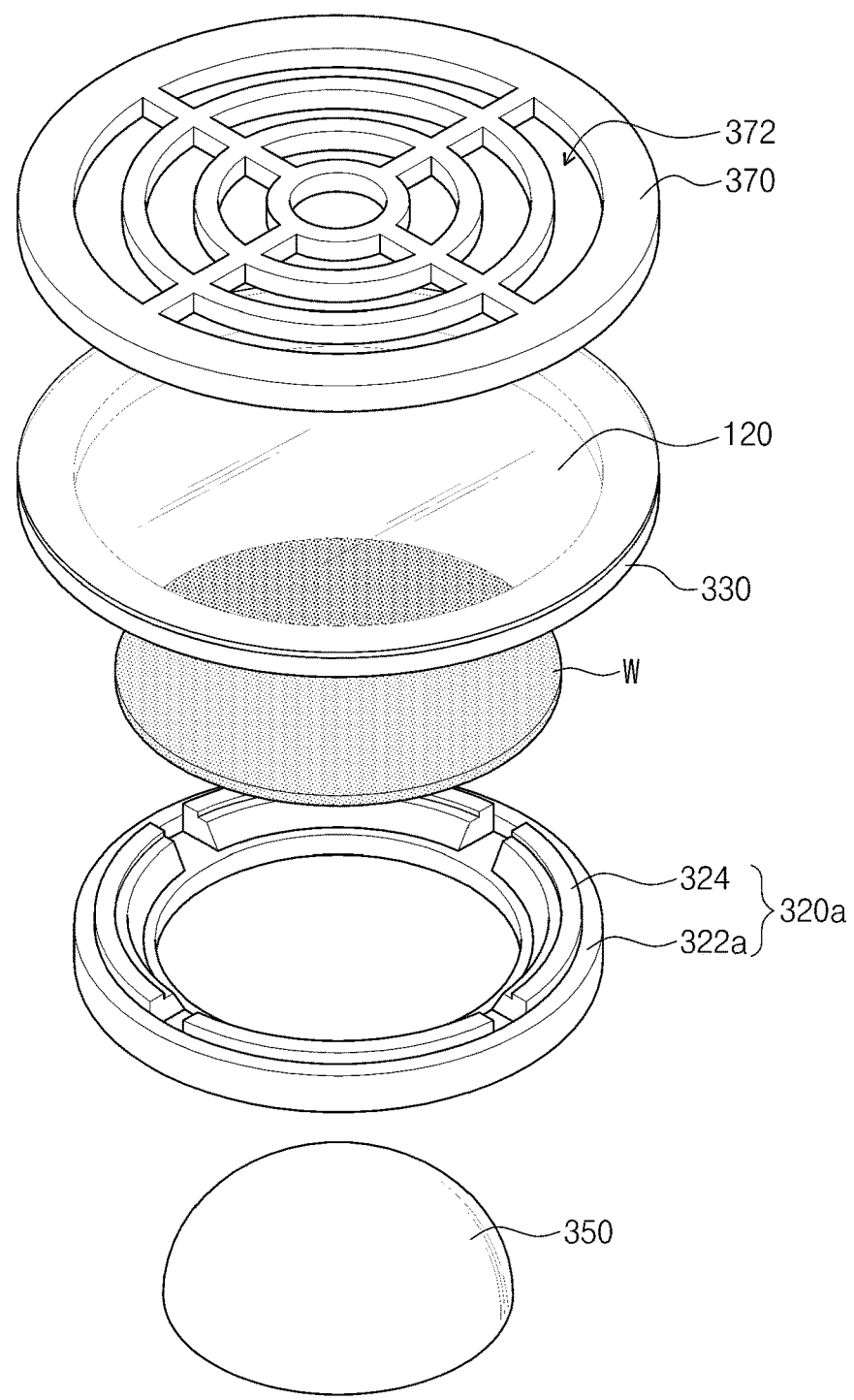
FIG. 8 is a perspective view illustrating a substrate holder, a film holder, a diaphragm, and a film compressing unit of FIG. 7.

The air flow plate may have a plurality of holes as shown in FIG. 4. For example, the first support 322 may have a planar portion having one or more holes in the planar portion. Alternatively, the air flow control plate may have one big hole in the middle of the air flow plate as shown in FIG. 8. For example, the first support 322 may have a ring shape. For example, the second supports 324 may be stepped rims as shown in FIGS. 4, 5 and 8. Each of the stepped rims may have a step positioned to receive a substrate on the step. For example, the step may include a recessed portion, recessed from a top-most surface, as shown in FIGS. 4 and 5 (323/323a).

The first support 322 may be provided to support the second supports 324. The first support 322 may be disposed to be parallel to the substrate W. For example, the first support 322 may be disposed below the bumps 110.

The second supports 324 may be disposed on an edge region of the first support 322. The second supports 324 may support an edge region of the top surface of the substrate W. The bumps 110 may be disposed between the second supports 324. For example, the second supports 324 may be formed of a material beneficial to protect the substrate W from being damaged by an impact and/or vibration, e.g., rubber or other soft materials. Accordingly, the second support 324 may protect the substrate W from being damaged by an impact and/or vibration, which may occur when the substrate W is disposed on the second supports 324. The second supports 324 may be configured to allow the substrate W to be spaced apart from the first support 322 by a first height h1. The first height h1 may be greater than a diameter of the bumps 110, or greater than a vertical height that the bumps extend above the top surface of the substrate W. The bumps 110 may be spaced apart from the first support 322. Thus, it may be beneficial to protect the bumps 110 from colliding with the first support 322. This may allow for the tape film 120 to be stably attached to the bottom surface of the substrate W, even when a protection layer (not shown) for protecting the bumps 110 is not formed. For example, the tape film 120 may be attached to the substrate W, without a protection film (not shown) for the bumps 110.

The lift pins 326 may support the first support 322. The lift pins 326 may be configured to control vertical positions of the first support 322 and the second supports 324. The lift pins may also be referred to as rods, or legs. A vertical distance between the substrate W and the tape film 120 may be controlled by the lift pins 326.

FIG. 4 is a perspective view illustrating an exemplary embodiment of the substrate holder 320 of FIG. 3.

Referring to FIGS. 3 and 4, the first support 322 of the substrate holder 320 may be provided in the form of a disc plate. The first support 322 may have first holes 321. The first holes 321 may be formed to allow air 130 between the substrate W and the first support 322 to pass through the first support 322. The term "air" as discussed herein, may refer to atmospheric air, or other gases that may be present during the manufacturing process. For example, the first air discharging unit 342 may remove gas from the lower housing 312, and the gas may be removed through the first air outlet 341. This may be similarly applied to the other components throughout the embodiments in this disclosure. The air 130 may be removed and/or exhausted by the first air discharging unit 342 through the first air outlet 341. For example, the air 130 may be partially removed from the inside of the lower housing 312 through the first air outlet 341 to reduce the air pressure inside the lower housing 312. In a stage of the lamination process, the tape film 120 may be bent toward the substrate W. For example, the tape film 120 may have a convex section or a meniscus shape that is bent toward the substrate W. During the lamination process, the tape film 120 may form a convex downward shape. The lamination process may proceed in a direction from a center region toward an edge region of the substrate W.

Each of the second supports 324 may be shaped like an arc in a plan view. Together, the second supports 324 may be located along an outline of a pattern such as a circle. Therefore, together, the second supports 324 may form a ring shape. The second supports 324 may have guiding recesses 323. The guiding recesses 323 may be configured to allow the substrate W to be fixed on the second supports 324. The guiding recesses 323 may be spaced apart from the first support 322, for example, in a direction perpendicular to the horizontal surface of the first support 322 by the first height h1. In some embodiments, the first height h1 may range from about 0.1 mm to about 3 mm. A width of an overlapping area of the guiding recesses 323 and the substrate W may be a first horizontal distance $d_1$. The first horizontal distance $d_1$ may range, for example, from about 0.6 mm to about 2 mm. For example, during the lamination process, an edge portion of the substrate W may contact the guiding recesses 323. The contact width of the substrate W with the guiding recesses 323 may be between about 0.6 mm and about 2 mm.

Side gaps 325 may be formed between the second supports 324. The side gaps 325 may allow the air 130 to flow from an internal region between the substrate W and the tape film 120 to an outer region outside the substrate holder 320 or vice versa.

The film holder 330 may be configured to immobilize the tape film 120. For example, an edge region of the tape film 120 may be attached to a top surface of the film holder 330. Alternatively, the edge region of the tape film 120 may be attached to a bottom surface of the film holder 330. In certain exemplary embodiments, the film holder 330 may be shaped like a ring in a plan view. The film holder 330 may have an inside diameter greater than a diameter of the substrate W. For example, a ring shaped film holder 330 may have an outer circular shape surface and an inner circular shape surface. The diameter of the inner circular shape surface may be an inside diameter of the film holder 330, and the diameter of the outer circular shape surface may be an outside diameter of the film holder 330. The inside diameter of the film holder 330 may be greater than the diameter of the substrate W. The diameter of the tape film 120 may be greater than the diameter of the substrate W. The outside diameter of the film holder 330 may be equal to the diameter of the tape film 120. In certain exemplary embodiments, the diameter of the tape film 120 may be greater or smaller than the outside diameter of the film holder 330.

Referring to FIG. 3, the film holder 330 may be disposed between the lower housing 312 and the upper housing 314 and on an inner surface of the chamber 310. The film holder 330 may have an outside diameter greater than inside diameters of the lower and/or upper housings 312 and/or 314. The film holder 330 may be connected to a groove 316, which is formed on inner side surfaces of the lower and upper housings 312 and 314. The film holder 330 may be disposed on the lower housing 312. For example, the tape film 120 and the film holder 330 may be provided to cover the lower housing 312.

FIG. 5 is a perspective view illustrating an exemplary embodiment of the substrate holder 320 of FIG. 3.

Referring to FIG. 5, each of the second supports 324a may be a block-shaped structure. The second supports 324a may be disposed along an edge region of the first support 322 to be spaced apart from each other by a specific distance (e.g., by the same distance). Each of the second supports 324a may have a guiding recess 323a. An edge of the substrate W may be aligned with the guiding recess 323a, when the substrate W is disposed on the substrate holder 320. The first height h1 and the first horizontal distance $d_1$ may be substantially equal to those of FIG. 4. The first support 322 may have substantially the same features as those of FIG. 4.

Referring back to FIG. 3, the first and second air discharging units 342 and 344 may be connected to the first and second air outlets 341 and 343, respectively. Each of the first and second air discharging units 342 and 344 may include a vacuum pump. For example, each of the first and second air discharging units 342 and 344 may be an electrically powered unit, such as a pump. For example, each of the first and second air discharging units 342 and 344 may include a fan. The first air discharging unit 342 may be configured to remove and/or exhaust the air 130 from the lower housing 312 to the outside of the chamber 310. For example, the air 130 may be partially removed from the inside of the lower housing 312 through the first air outlet 341 to reduce the air pressure inside the lower housing 312. For example, the film holder 330 and the tape film 120 may divide the chamber 310 into two portions, e.g., an upper portion and a lower portion, and air may not substantially move between the two portions. The second air discharging unit 344 may be configured to remove and/or exhaust the air 130 from the upper housing 314 to the outside of the chamber 310. For example, similarly to the description above with regard to the first discharging unit 342, the air 130 may be partially removed from the inside of the upper housing 314 through the second air outlet 343 to reduce the air pressure inside of the upper housing 314. An air pumping pressure of the second air discharging unit 344 is lower than an air pumping pressure of the first air discharging unit 342. The air 130 in the lower housing 312 may have a pressure that is lower than that of the air 130 in the upper housing 314. For example, the upper housing 314 may have an atmospheric pressure, and the lower housing 312 may have a vacuum pressure that is lower than the atmospheric pressure. In certain exemplary embodiments, the upper housing 314 may have a pressure of several tens mTorr, and the lower housing 312 may have a pressure of several mTorr. In the case where the pressure of the air 130 in the lower housing 312 is excessively high, the second air discharging unit 344 may be configured to supply the air 130 into the upper housing 314. In a stage of the lamination process, the tape film 120 may be bent toward the substrate W in the lower housing 312. In certain exemplary embodiments, the tape film 120 may be in contact with a top or bottom surface of the substrate W. In certain exemplary embodiments, the lift pins 326 may be vertically moved to allow the tape film 120 to be in contact with the substrate W.

Figure 6:
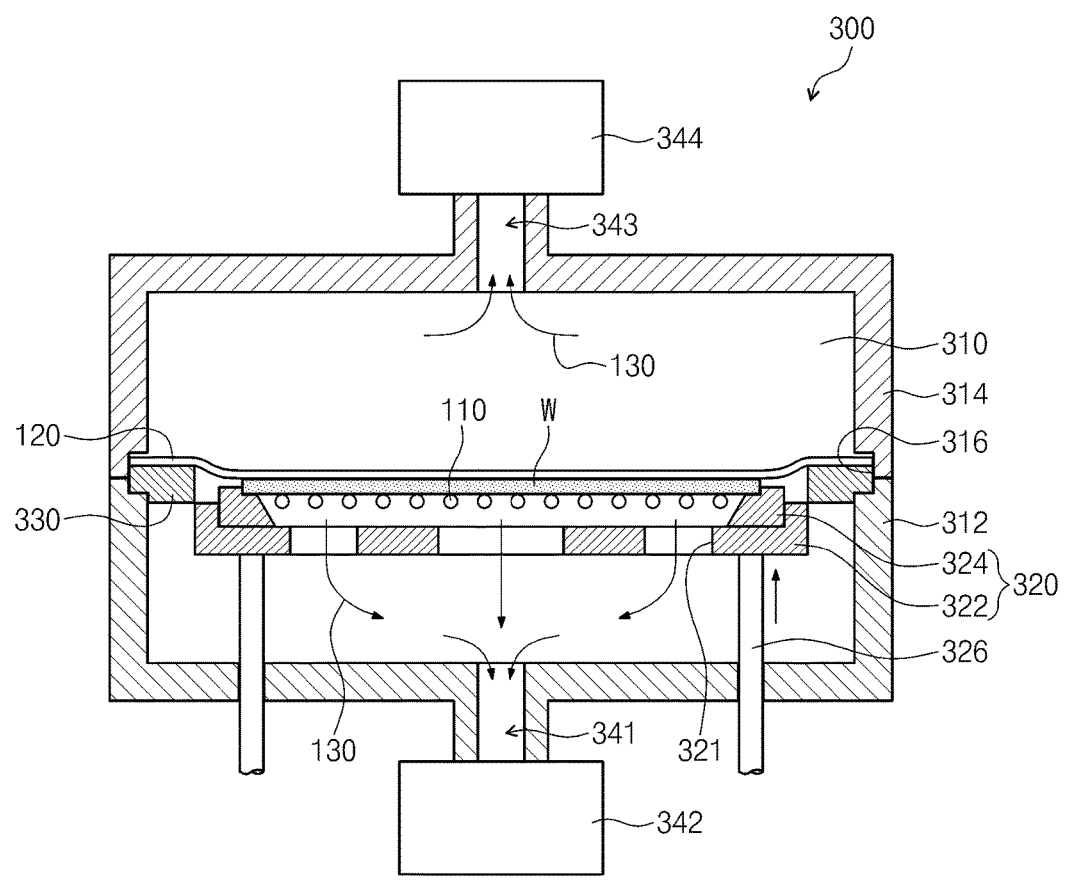
FIG. 6 is a cross-sectional view illustrating a process of attaching a tape film to a substrate of FIG. 3.

FIG. 6 is a cross-sectional view illustrating a process of attaching the tape film 120 to the substrate W of FIG. 3.

Referring to FIG. 6, in the case where the substrate W is elevated by the lift pins 326, the attachment between the tape film 120 and the substrate W may be gradually performed in a direction from a center region toward an edge region. The tape film 120 may be attached to the bottom surface of the substrate W without bubbles 140 (e.g., see FIG. 10). The chamber 310, the substrate holder 320, the film holder 330, and the first and second air discharging units 342 and 344 may have substantially the same features as those of FIG. 3.

Figure 7:
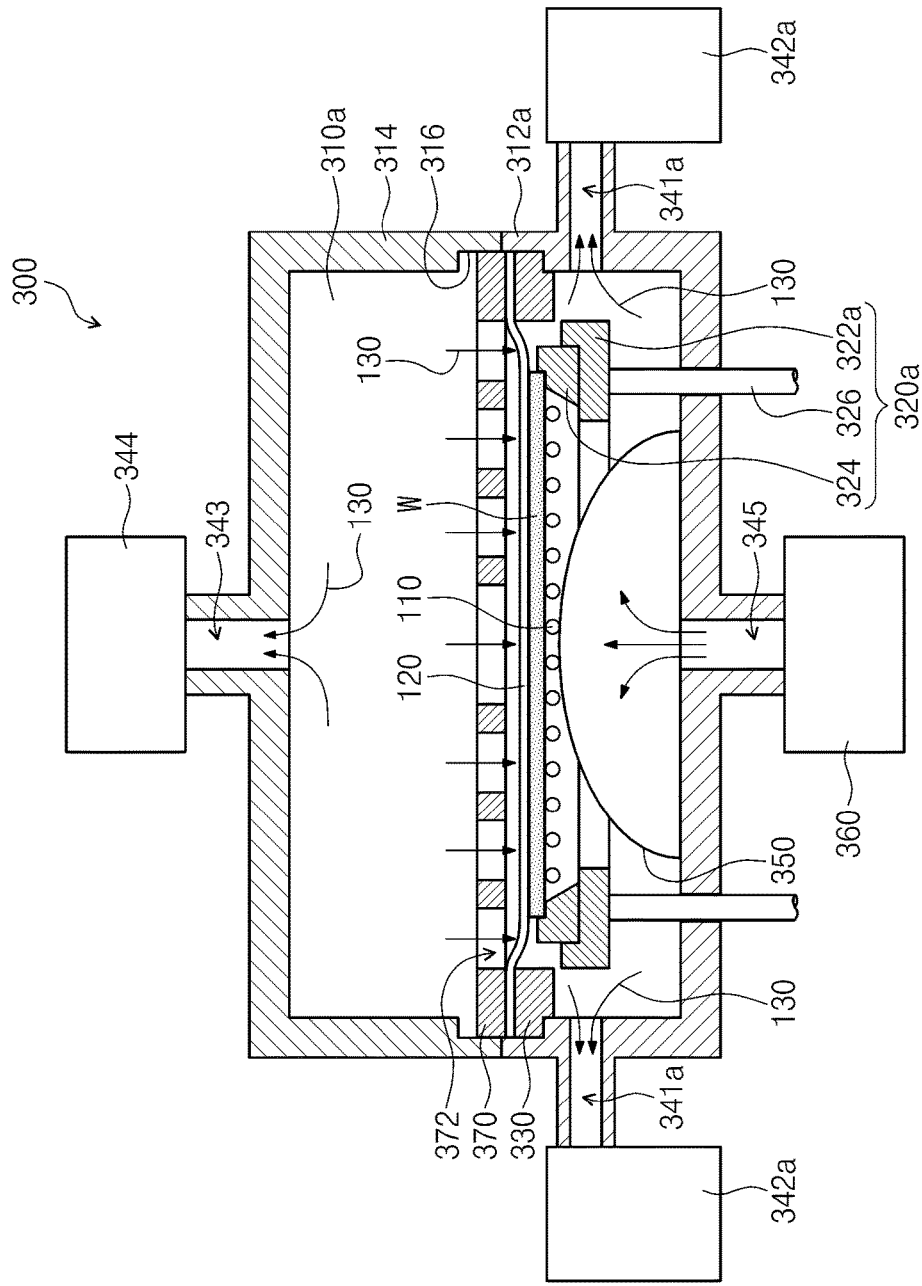
FIG. 7 is a cross-sectional view illustrating an exemplary embodiment of a lamination apparatus of FIG. 1.

FIG. 7 is a cross-sectional view illustrating an exemplary embodiment of the lamination apparatus 300 of FIG. 1

Referring to FIG. 7, the lamination apparatus 300 may include a chamber 310a, a substrate holder 320a, a film holder 330, first and second air discharging units 342a and 344, a diaphragm 350, an air supplying unit 360, and a film compressing unit 370.

The lower housing 312a of the chamber 310a may include first air outlets 341a and a first air inlet 345. The first air outlets 341a may be provided to penetrate a sidewall of the lower housing 312a. The first air outlets 341a may be disposed adjacent to the upper housing 314 and the film holder 330. The first air inlet 345 may be provided to penetrate a bottom portion of the lower housing 312.

The first air discharging units 342a may be connected to the first air outlets 341a. The first air discharging units 342a may be used to remove and/or exhaust the air 130 between the substrate W and the tape film 120 to the outside through the first air outlets 341a. For example, the air 130 may be partially removed from the inside of the lower housing 312a through the first air outlets 341a to reduce the air pressure inside the lower housing 312. For example, the air 130 between the substrate W and the tape film 120 may be exhausted so that the substrate W and the tape film 120 are attached without air between them. The substrate W and the tape film 120 may be attached to each other using a pressure difference between the first and second air discharging units 342a and 344.

The diaphragm 350 may be disposed on the bottom portion of the lower housing 312a. In certain exemplary embodiments, the diaphragm 350 may be disposed on the first air inlet 345. The diaphragm 350 may have a diameter smaller than an inside diameter of the first support 322. For example, the first support 322 may have a ring shape or a similar shape to a ring, and an inside diameter of the first support 322 may be a diameter of a circle formed by an inner surface of the first support 322. In certain exemplary embodiments, the diaphragm 350 may have a diameter larger than the inside diameter of the first support 322.

The air supplying unit 360 may be connected to the first air inlet 345. The air supplying unit 360 may be configured to supply air 130 in a diaphragm region defined by the diaphragm 350 through the first air inlet 345. In the case where the air 130 has an excessively low pressure in a region between the substrate W and the tape film 120, the air supplying unit 360 may remove and/or exhaust the air 130 from the diaphragm region. For example, the air pressure between the diaphragm 350 and the lower housing 312a may be adjusted by removing and/or injecting air between the diaphragm 350 and the lower housing 312a. The diaphragm 350 may be expanded. For example, the diaphragm 350 may be expanded by the air pressure differences between both sides of the diaphragm 350. For example, the diaphragm 350 may be expanded into the first support 322a. In this case, the diaphragm 350 may press the bumps 110 and the substrate W against the tape film 120 and the film compressing unit 370.

The film compressing unit 370 may be disposed on the film holder 330 and the tape film 120. The tape film 120 may be disposed between the film compressing unit 370 and the film holder 330. The film compressing unit 370 and the film holder 330 may be fixedly connected to the groove 316, which is formed on inner side surfaces of the lower and/or upper housings 312a and 314. In certain exemplary embodiments, the film compressing unit 370 may be a plate-shaped structure. The film compressing unit 370 may be provided to cover the tape film 120. In the case where the substrate W is elevated by the diaphragm 350, the film compressing unit 370 may press the tape film 120 against the substrate W. The tape film 120 may be attached to the substrate W by forces exerted from the diaphragm 350 and the film compressing unit 370.

FIG. 8 is a perspective view illustrating the substrate holder 320a, the film holder 330, the diaphragm 350, and the film compressing unit 370 of FIG. 7.

Referring to FIGS. 7 and 8, the first support 322a of the substrate holder 320a may be a ring-shaped structure. The first support 322a may have an inside diameter that is smaller than the diameter of the substrate W. In certain exemplary embodiments, the first support 322a may have an outside diameter that is smaller than the inside diameter of the film holder 330. Alternatively, the first support 322a may have an outside diameter that is larger than the inside diameter of the film holder 330.

The film compressing unit 370 may have second holes 372. The air 130 in the upper housing 314 may be supplied into a region between the film compressing unit 370 and the tape film 120 through the second holes 372. The tape film 120 may be bent in a direction away from the film compressing unit 370, thereby being in contact with the substrate W.

The second support 324, the lift pins 326, and the film holder 330 may have substantially the same features as those of FIG. 4.

Figure 9:
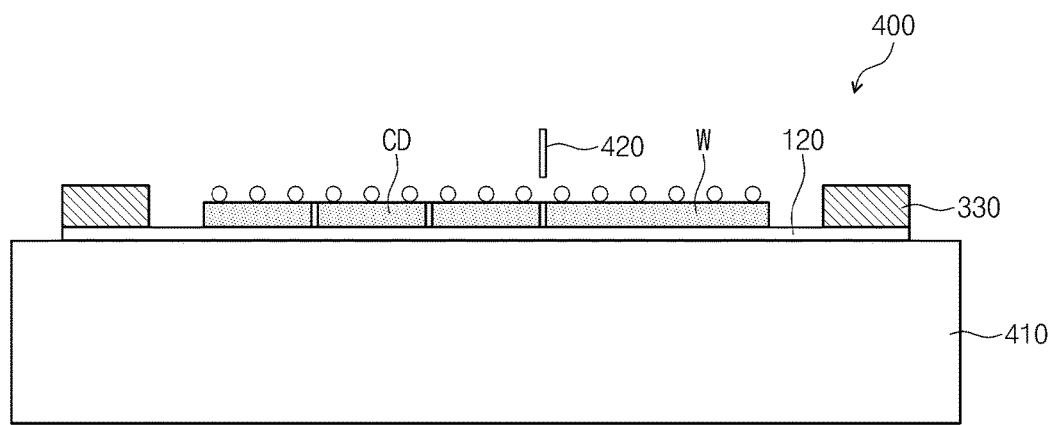
FIG. 9 is a cross-sectional view illustrating an exemplary embodiment of a dicing apparatus of FIG. 1.

FIG. 9 is a cross-sectional view illustrating an exemplary embodiment of the dicing apparatus 400 of FIG. 1.

Referring to FIG. 9, the dicing apparatus 400 may be configured to perform a dicing process of dividing the substrate W into a plurality of chip dies CD. In certain exemplary embodiments, the dicing apparatus 400 may include a stage 410 and a saw 420. The stage 410 may be configured to load the tape film 120 and the film holder 330. The saw 420 may be used to cut the substrate W into the chip dies CD. In certain exemplary embodiments, the dicing process of the substrate W may be performed using a laser beam (not shown). The substrate W and the chip dies CD may be attached to the tape film 120, and may be positioned at predetermined positions on the stage 410 during the dicing process. The use of the tape film 120 may be beneficial to reduce the substrate W and the chip dies CD sliding or bounding in the dicing apparatus 400.

The film holder 330 may fasten the tape film 120 to the stage 410. The use of the film holder 330 may be beneficial to safely deliver the tape film 120, the substrate W, and the chip dies CD, when the tape film 120, the substrate W, and the chip dies CD are transferred by a delivery tool (not shown). Thereafter, the film holder 330 may be separated from the tape film 120.

Figure 10:
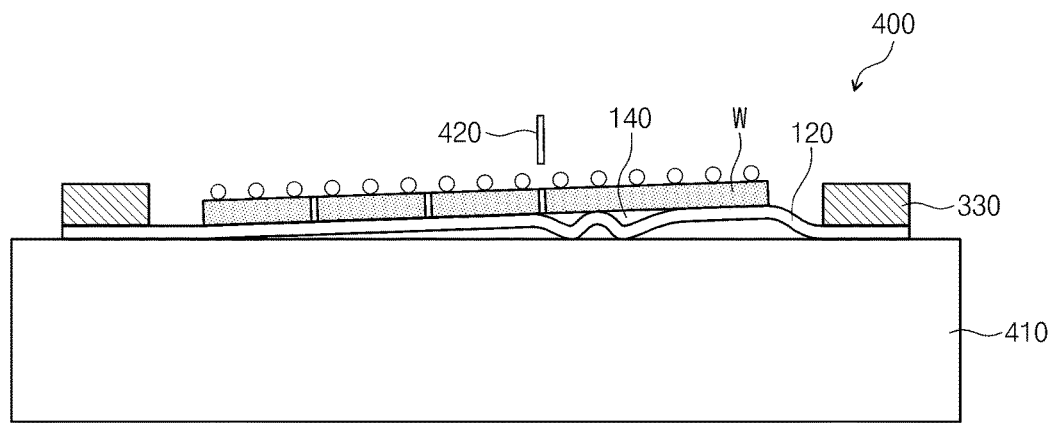
FIG. 10 is a cross-sectional view illustrating an exemplary embodiment of process failures in a dicing process, which may be caused by bubbles between a substrate and a tape film in FIG. 9.

FIG. 10 is a cross-sectional view illustrating an example of process failures in a dicing process, which may be caused by the bubbles 140 between the substrate W and the tape film 120 in FIG. 9.

Referring to FIG. 10, the bubbles 140 may be produced between the substrate W and the tape film 120. In this case, the substrate W and the tape film 120 may not be stably fastened to the stage 410. For example, the substrate W may be inclined with respect to the stage 410. Accordingly, the dicing process may be performed on the substrate W that is at an angle to the stage 410. This may lead to process failures (e.g., abnormal cutting of the substrate W or colliding of the chip dies CD) in the dicing process.

Referring back to FIGS. 6 and 10, the lamination apparatus 300 may prevent the bubbles 140 from being produced between the tape film 120 and the substrate W. Accordingly, it is possible to prevent or reduce the process failure from occurring in the dicing process and/or the dicing apparatus 400.

Figure 11:
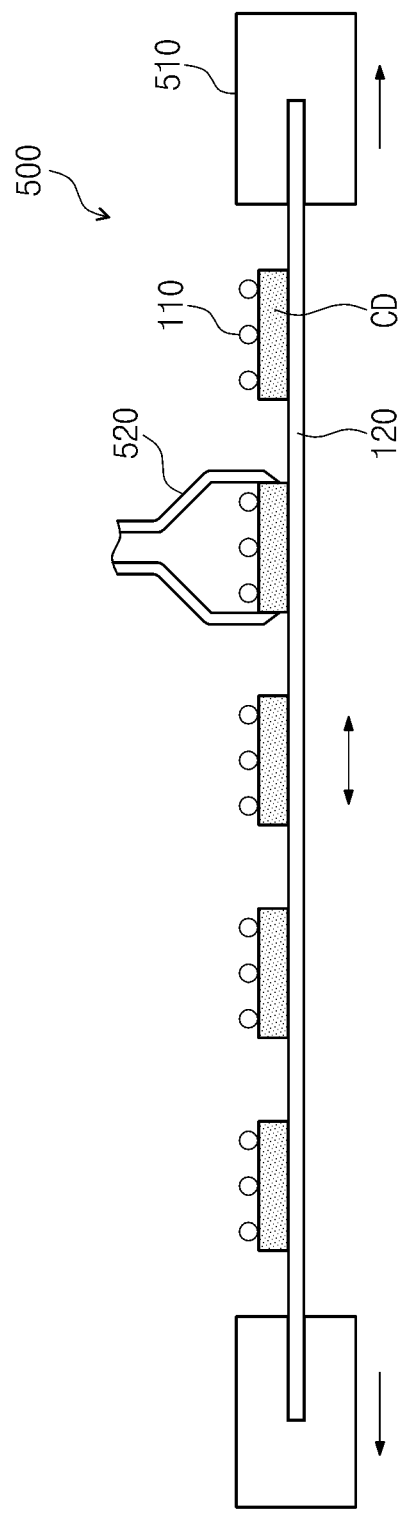
FIG. 11 is a cross-sectional view illustrating an exemplary embodiment of a pick-up apparatus of FIG. 1.

FIG. 11 is a schematic diagram illustrating an exemplary embodiment of the pick-up apparatus 500 of FIG. 1.

Referring to FIG. 11, the pick-up apparatus 500 may include expanders 510 and tongs 520. The expanders 510 may be configured to grasp opposite edges of the tape film 120. The expanders 510 may be configured to expand the tape film 120. For example, the tape film 120 may be stretched in its longitudinal direction by the expanders 510. This may make it possible to increase a surface area of the tape film 120 and a distance between the chip dies CD. The tongs 520 may be configured to pick up each of the chip dies CD. The tongs 520 may be configured to transfer each of the chip dies CD to the outside (e.g., outside of a dicing apparatus 400. In certain exemplary embodiments, the tongs 520 may be configured to perform the pick-up and transfer process on a plurality of the chip dies CD.

According to certain exemplary embodiments of the inventive concept, a lamination apparatus may include a chamber, a substrate holder, a film holder, and an air discharging unit. The chamber and the air discharging unit may be configured to remove and/or exhaust air from a region between the substrate holder and the film holder, and this may allow for attachment of a tape film on the film holder to a substrate on the substrate holder, without occurrence of bubbles between the substrate and the tape film. The substrate holder may be provided to support an edge region of the substrate, which is outside the region where bumps are disposed. Aspects of embodiments provide a method for attaching the tape film to the substrate, without a layer for protecting the bumps.

Air discharging units 342, 342*a*, and 344 in the previous embodiments may also be referred to as air removal units.

Hereinafter, methods of manufacturing a semiconductor device will be described. Structural details and/or positional details of the elements described above with regard to various embodiments may also be applied to the methods of manufacturing a semiconductor device described below.

After various circuit devices are formed on a substrate W, a wafer level packaging is performed on the substrate W as shown in FIG. 2. For example, a soldering process is performed on the wafer substrate W.

Referring to FIG. 3, a substrate W may be loaded on the substrate holder 320. Before the substrate W is loaded on the substrate holder 320, the upper housing 314 may be opened for the substrate W to move in the chamber 310. The substrate W may be formed with semiconductor devices. The semiconductor devices may be MOS FET, CMOS, etc. The substrate W may be loaded on the substrate holder 320 upside down. For example, the semiconductor devices formed surface may face downward. A tape film 120 may be disposed over the substrate W. The tape film 120 may be attached to a film holder 330 before the film is disposed over the substrate W. For example, the tape film 120 may be attached to the film holder 330 outside the chamber 310. For example, the tape film 120 may be attached to the film holder 330 with an adhesive.

After the placement of the tape film 120 over the substrate W, the upper housing 314 may be closed. For example, the upper housing 314 may be disposed on the lower housing 312. The tape film 120 combined with the film holder 330 may divide the chamber 310 into two regions (e.g., an upper region and a lower region.) The tape film 120 and the film holder 330 may prevent substantial air flow between the upper and lower regions of the chamber. A gasket (not shown) may be disposed at a connection area between the lower housing 312 and the upper housing 314. The gasket may be formed of rubber, plastic, metal etc. For example, the gasket may be fiber reinforced plastic (FRP), poly vinyl chloride (PVC), etc. The gasket may be a liquid gasket. For example, the gasket may be an oil. The gasket may be grease. The gasket may include two or more components. For example, the gasket may include two different materials. For example, the gasket may include a metal gasket and grease.

After the upper housing 314 is closed, the first air removal unit 342 may remove a portion of air from the lower region of the chamber 310. As the air pressure of the lower region of the chamber 310 is getting lower, the tape film 120 is bent toward the substrate W from the center portion of the tape film 120, thereby attaching to the substrate W. In certain embodiments, the second air removal unit 344 may also remove a portion of air from the upper region of the chamber 310, thereby making the air pressure of the upper region of the chamber 310 lower than the atmospheric pressure. In this case, the lower region of the chamber 310 may maintain an air pressure lower than the air pressure of the upper region of the chamber 310 while the tape film 120 is being attached to the substrate W. Removing air from the both regions (the upper and lower regions) of the chamber 310 at the same time may be helpful to prevent or reduce air bubbles between the tape film 120 and the substrate W.

In certain embodiments, a diaphragm 350 may be used during the attachment process between the tape film 120 and the substrate W as shown in FIG. 7 and as discussed in the related description above. The diaphragm 350 may support the substrate W during the attachment process. The diaphragm 350 may be helpful to reduce or prevent the substrate W from being bent, thereby helping to protect the substrate W from being damaged.

After the tape film 120 is attached on the substrate W, the upper housing 314 is opened, and the substrate W, the tape film 120 and the film holder 330 may be removed from the chamber 310 and moved to a dicing apparatus 400. In certain embodiments, the air pressures of the upper and lower regions of the chamber 310 may be raised to be the same as or similar to the atmospheric pressure before opening the upper housing 314.

After the substrate W, the tape film 120, and the film holder 330 are removed to the dicing apparatus 400, the substrate W may be divided into a plurality of chip dies CD. The use of the tape film 120 may be helpful to reduce the substrate W and the chip dies CD sliding or bouncing in the dicing apparatus 400 during the dicing process.

While example embodiments of the inventive concepts have been particularly shown and described, it will be understood by one of ordinary skill in the art that variations in form and detail may be made therein without departing from the spirit and scope of the attached claims.

What is claimed is:

1. A lamination apparatus, comprising:
a first housing;
a substrate holder disposed in the first housing and positioned to receive a substrate;
a film holder disposed on the first housing and positioned to support a tape film; and
a first air removal unit connected to the first housing,
wherein the first air removal unit is positioned to remove air from the first housing in order to attach the tape film to the substrate;
wherein the substrate holder comprises:
an air flow plate having a hole in the plate; and
a stepped rim disposed on an edge region of the air flow plate positioned to receive an edge region of the substrate; and
wherein the stepped rim has a guiding recess, allowing the substrate to be fastened to a position that is spaced apart from the air flow plate by a height greater than a height of bumps on the substrate.

2. The apparatus of claim 1, wherein the first air removal unit is connected to a bottom portion of the first housing.

3. The apparatus of claim 1, wherein the hole of the air flow plate is configured to allow the air to be removed from a region below the substrate by the first air removal unit.

4. The apparatus of claim 1, wherein the film holder has an inside diameter greater than a diameter of the air flow plate and has an outside diameter greater than an inside diameter of the first housing.

5. The apparatus of claim 1, further comprising:
a diaphragm disposed below the substrate holder and connected to a bottom portion of the first housing; and
an air supplying unit disposed below the diaphragm and connected to the bottom portion of the first housing,
wherein the air supplying unit is positioned to supply air into a region defined by the diaphragm and to expand the diaphragm into the substrate holder.

6. The apparatus of claim 5, wherein the first housing has a sidewall positioned outside the diaphragm, and the first air removal unit is connected to the sidewall of the first housing.

7. The apparatus of claim 1, further comprising:
a second housing disposed on the first housing; and
a second air removal unit connected to the second housing and positioned to remove air from the second housing with an air pumping pressure lower than an air pumping pressure of the first air removal unit resulting in an air pressure in the second housing that is higher than an air pressure in the first housing.

8. The apparatus of claim 1, further comprising a film compressing unit disposed on the film holder and the tape film,
wherein the film compressing unit has a second hole, allowing the air in a second housing to flow therethrough toward the tape film.

9. A system of fabricating a semiconductor device, comprising:
a packaging apparatus configured to attach a plurality of bumps to a first surface of a substrate;
a lamination apparatus configured to attach a tape film to a second surface of the substrate facing the first surface; and
a dicing apparatus configured to cut the substrate attached to the tape film into a plurality of dies,
wherein the lamination apparatus comprises:
a first housing;
a substrate holder disposed in the first housing and configured to receive the substrate;
a film holder disposed on the first housing and configured to support the tape film; and
a first air removal unit connected to the first housing,
wherein the first air removal unit is configured to remove air from the first housing in order to attach the tape film to the second surface of the substrate,
wherein the substrate holder comprises:
a first support having a diameter smaller than an inside diameter of the first housing; and
a second support disposed on an edge region of the first support, the second support being configured to support an edge portion of the substrate outside the bumps, and
wherein the second support is configured to receive an edge region of the first surface of the substrate and to separate the substrate from the first support by a height greater than a diameter of the bumps.

10. The system of claim 9, wherein the dicing apparatus comprises:
a stage configured to receive the film holder, the tape film, and the substrate; and
a saw configured to cut the substrate into a plurality of chip dies,
wherein the film holder is configured to fasten the tape film, the substrate, and the chip dies on the stage.

11. The system of claim 9, wherein the lamination apparatus further comprises:
a diaphragm disposed below the first support and connected to a bottom portion of the first housing; and
an air supplying unit disposed below the diaphragm and connected to the bottom portion of the first housing,
wherein the air supplying unit is configured to supply the air into a region defined by the diaphragm and thereby to press the diaphragm against the bumps and the substrate.

12. The system of claim 9, wherein the lamination apparatus further comprises:
a second housing disposed on the first housing;
a second air removal unit connected to the second housing and configured to remove air from the second housing with an air pumping pressure lower than an air pumping pressure of the first air removal unit such that an air pressure in the second housing is higher than an air pressure in the first housing; and
a film compressing unit disposed on the film holder and the tape film in the second housing, wherein the film compressing unit has a second hole, allowing the air in the second housing to flow therethrough toward the tape film.

13. A lamination apparatus, comprising:
a chamber;
a substrate holder disposed in the chamber and configured to receive a substrate;
a film holder disposed adjacent to the substrate holder and configured to support a tape film; and
a first air removal unit connected to the chamber,
wherein the substrate holder comprises a first support and a second support,
wherein the second support is disposed on an edge region of the first support,
wherein the substrate holder is configured so that a center region of the substrate is disposed above the first support and the center region of the substrate is spaced apart from the first support,
wherein the second support is configured to receive an edge region of the substrate, and
wherein the first air removal unit is configured to remove air between the substrate and the tape film and thereby to attach the tape film to the substrate.

14. The apparatus of claim 13, wherein the chamber is formed by a lower housing and an upper housing disposed on the lower housing, and
wherein the substrate holder is disposed in the lower housing.

15. The apparatus of claim 14, wherein the film holder is connected to inner side surfaces of the lower and upper housings.

16. The apparatus of claim 14, further comprising:
a second air removal unit connected to the upper housing,
wherein the first air removal unit is connected to the lower housing, and
the second air removal unit is configured to remove air in the upper housing with an air pumping pressure lower than an air pumping pressure of the first air removal unit such that an air pressure in the upper housing is higher than an air pressure in the lower housing.

17. The apparatus of claim 14, further comprising:
a diaphragm disposed below the substrate holder and connected to a bottom portion of the lower housing; and
an air supplying unit disposed below the diaphragm and connected to the bottom portion of the lower housing,
wherein the air supplying unit is configured to supply air into a region defined by the diaphragm and to expand the diaphragm, and
the lower housing has a sidewall which is positioned outside the diaphragm and is connected to the first air removal unit.

18. The apparatus of claim 13, wherein the first support comprises a first hole configured to allow air between the substrate and the first support to pass through the first hole, and
wherein the substrate holder is configured so that the substrate is disposed above the first hole and the substrate is spaced apart from a top of the first hole.

19. The apparatus of claim 13, wherein the first support and the second support are separable from each other.

20. The apparatus of claim 13, wherein the second support comprises a guiding recess allowing the substrate to be fastened in the guiding recess.

* * * * *